US009126432B2

(12) United States Patent
Molamphy

(10) Patent No.: US 9,126,432 B2
(45) Date of Patent: Sep. 8, 2015

(54) DIFFERENTIAL ULTRAVIOLET CURING USING EXTERNAL OPTICAL ELEMENTS

(75) Inventor: Thomas Molamphy, Portland, OR (US)

(73) Assignee: Phoseon Technology, Inc., Hillsboro, OR (US)

(*) Notice: Subject to any disclaimer, the term of this patent is extended or adjusted under 35 U.S.C. 154(b) by 414 days.

(21) Appl. No.: 13/237,811

(22) Filed: Sep. 20, 2011

(65) Prior Publication Data

US 2013/0069083 A1 Mar. 21, 2013

(51) Int. Cl.
*H01L 29/18* (2006.01)
*B41J 11/00* (2006.01)
*F26B 3/28* (2006.01)

(52) U.S. Cl.
CPC . *B41J 11/002* (2013.01); *F26B 3/28* (2013.01)

(58) Field of Classification Search
CPC ....... H01L 27/1464; B41J 11/002; F26B 3/28
USPC ................................ 34/275; 257/88, E33.06
See application file for complete search history.

(56) References Cited

U.S. PATENT DOCUMENTS 5,857,767 A 1/1999 Hochstein
5,936,353 A 8/1999 Triner et al.
6,200,134 B1 3/2001 Kovac et al.
6,457,823 B1 10/2002 Cleary et al.
6,501,084 B1 12/2002 Sakai et al.
6,683,421 B1 1/2004 Kennedy et al.
6,692,250 B1 2/2004 Decaudin et al.
7,549,740 B2 * 6/2009 Yokoyama et al. ........... 347/102
7,642,527 B2 * 1/2010 Marson et al. ............. 250/492.1
8,002,936 B2 * 8/2011 Roof .......................... 156/273.7
2001/0046652 A1 11/2001 Ostler et al.
2002/0187454 A1 12/2002 Melikechi et al.
2003/0043582 A1 3/2003 Chan et al.
2003/0072054 A1 * 4/2003 DeCusatis et al. ............ 359/124
2003/0081096 A1 * 5/2003 Young ........................... 347/102
2003/0226463 A1 * 12/2003 Teng .......................... 101/463.1
2003/0227527 A1 12/2003 Richards
2004/0227801 A1 * 11/2004 Kumamoto et al. .......... 347/102
2005/0128274 A1 * 6/2005 Matsushima et al. ......... 347/102
2005/0212855 A1 * 9/2005 Yokoyama et al. ............. 347/45
2006/0290760 A1 * 12/2006 German et al. ............... 347/102

(Continued)

FOREIGN PATENT DOCUMENTS

DE 19619154 A1 6/1997
DE 10127171 A1 12/2001

(Continued)

OTHER PUBLICATIONS

Data Sheet for GSiC Technology Super Blue LEDs No. C430-CB290-E1200, manufactured by Opto Semiconductors, May 1, 1999, 8 pages.

(Continued)

*Primary Examiner* — Vongsavanh Sengdara
(74) *Attorney, Agent, or Firm* — Alleman Hall McCoy Russell & Tuttle LLP

(57) ABSTRACT

A lighting module has an array of solid state light emitters, a package in which the array of solid state light emitters resides, the package having a window and an external optical element arranged adjacent the window, the external optical element having a coating, the coating forming an optical pattern when illuminated by light from the array of solid state light emitters.

15 Claims, 2 Drawing Sheets

(56) References Cited

U.S. PATENT DOCUMENTS

| | | | | |
|---|---|---|---|---|
| 2007/0109382 | A1* | 5/2007 | Lafleche et al. | 347/102 |
| 2007/0247503 | A1* | 10/2007 | Fukawa et al. | 347/100 |
| 2008/0088689 | A1* | 4/2008 | Korem | 347/102 |
| 2008/0170104 | A1 | 7/2008 | Iwase | |
| 2008/0174648 | A1 | 7/2008 | Nakano et al. | |
| 2008/0218539 | A1* | 9/2008 | Hill et al. | 347/7 |
| 2009/0225143 | A1* | 9/2009 | Fukui | 347/102 |
| 2009/0244157 | A1* | 10/2009 | Hishida et al. | 347/16 |
| 2010/0247795 | A1* | 9/2010 | Heath | 427/511 |
| 2011/0140608 | A1* | 6/2011 | Marson | 315/127 |
| 2011/0285789 | A1* | 11/2011 | Yokouchi | 347/47 |
| 2012/0113199 | A1* | 5/2012 | Edwards | 347/102 |
| 2012/0287212 | A1* | 11/2012 | Chretien et al. | 347/102 |
| 2012/0314011 | A1* | 12/2012 | Wetjens et al. | 347/102 |
| 2013/0070035 | A1* | 3/2013 | Yang et al. | 347/102 |
| 2013/0224636 | A1* | 8/2013 | Kobrin | 430/5 |
| 2013/0328981 | A1* | 12/2013 | Mitsuzawa | 347/102 |

FOREIGN PATENT DOCUMENTS

| | | | |
|---|---|---|---|
| EP | 0879582 | A1 | 11/1998 |
| EP | 1158761 | A1 | 11/2001 |
| EP | 1599340 | B1 | 9/2007 |
| JP | 2004237603 | A | 8/2004 |
| WO | 9507731 | A1 | 3/1995 |
| WO | 0059671 | A1 | 10/2000 |
| WO | 0067048 | A2 | 11/2000 |
| WO | 0211640 | A2 | 2/2002 |
| WO | 0213231 | A2 | 2/2002 |
| WO | 03023875 | A2 | 3/2003 |
| WO | 2006090541 | A1 | 8/2006 |
| WO | 2011061136 | A1 | 5/2011 |

OTHER PUBLICATIONS

Data Sheet for 5.0 mm Blue Series LEDs No. LNG992CFB, manufactured by the Panasonic Corporation, Mar. 2001, 1 page.

Data Sheet for 3.0 mm Blue Series LEDs No. LNG997CKB, manufactured by the Panasonic Corporation, Mar. 2001, 1 page.

Data Sheet for GSiC Technology Ultraviolet LEDs No. C395-MB290-E0400, manufactured by Cree, Inc., 2 pages.

ISA Korea, International Search Report and Written Opinion of PCT/US2012/056126, Feb. 18, 2013, WIPO, 11 pages.

* cited by examiner

DIFFERENTIAL ULTRAVIOLET CURING USING EXTERNAL OPTICAL ELEMENTS

BACKGROUND

Many different types of coatings and inks rely upon curing by ultraviolet (UV) light. The coatings and inks may create a particular finish or have particular advantages over more traditional materials. For example, one type of ink that relies upon UV curing consists of a gel-type ink, rather than a traditional liquid ink. The gel ink typically has a much higher percentage of solids in the ink. This typically results in better color saturation and allows for better color saturation for thinner layers of ink on the print surface, giving the resultant images brighter and deeper colors.

An issue that arises in printing involves the gloss of the printed image. Gloss typically means the level or reflectivity or shine on an image. Controlling gloss provides a printer the ability to select different levels of gloss for different applications. In some cases, the printer may want high gloss, in other less gloss, or more of a matte finish.

UV curing applications have begun to employ solid state lighting modules, rather than more traditional curing systems like mercury arc lamps. Solid state lighting modules typically use laser diodes or light-emitting diodes (LEDs), avoiding the use of the arc lamps and their accompanying hazardous materials. Solid state modules typically use less power, operate at lower temperatures and can provide some levels of control through control of arrays of LEDs, rather than a single lamp. Solid state lighting modules may also provide for some added flexibility with regard to the optics used in a curing system.

DETAILED DESCRIPTION OF THE EMBODIMENTS

Figure 1:
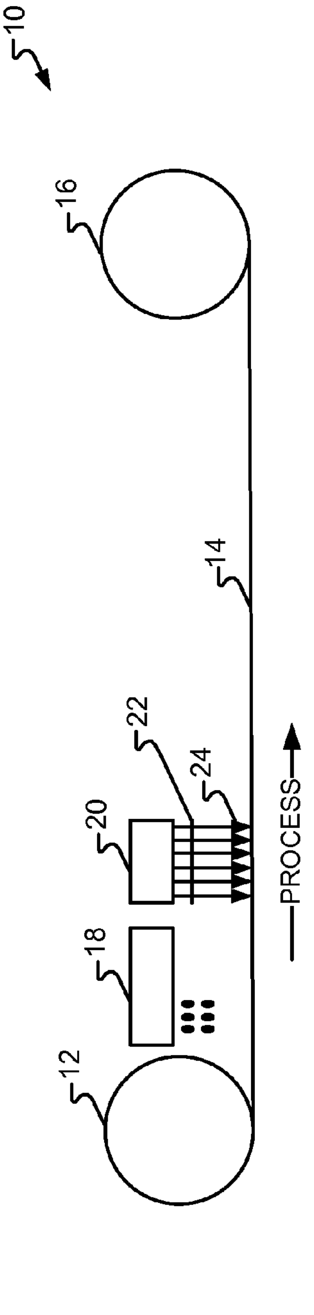
FIG. 1 shows an embodiment of a printing system using differential curing.

FIG. 1 shows an embodiment of a printing system using differential curing. In the particular embodiment, the printing system consists of a 'web' or roll-to-roll printing system. However, this provides merely one example of possible systems. The print system could also be a sheet fed system, where the print substrates consist of individual sheets of paper, or a cut sheet system, where the substrate is printed on the roll and then cut after printing without being taken up by a second roll. No limitation is intended, nor should any be implied by the examples and discussions contained here.

In FIG. 1, the printing system 10 consists of a roll-to-roll configuration where the print substrate 14 enters the printing process from dispenser roll 12 and exits when collected by the uptake roll 16. The print head 18 dispenses ink onto the print substrate 14 as it moves in the direction of the PROCESS arrow. The print head may dispense many different types of ink, including liquid, gel or paste, but all inks require some sort of curing to solidify the image to avoid smearing or other damage to the image.

Typically, an energy source of some type transmits energy to the uncured ink dispensed from the print head 18. The energy source may consist of radiation in the form of heat or light, chemicals in the form of curing compounds, etc. This discussion will focus on light, which may or may not include infrared light that may otherwise be considered heat. In this particular embodiment, the curing system uses ultraviolet light and the inks comprise ultraviolet light-curable inks.

Figure 2:
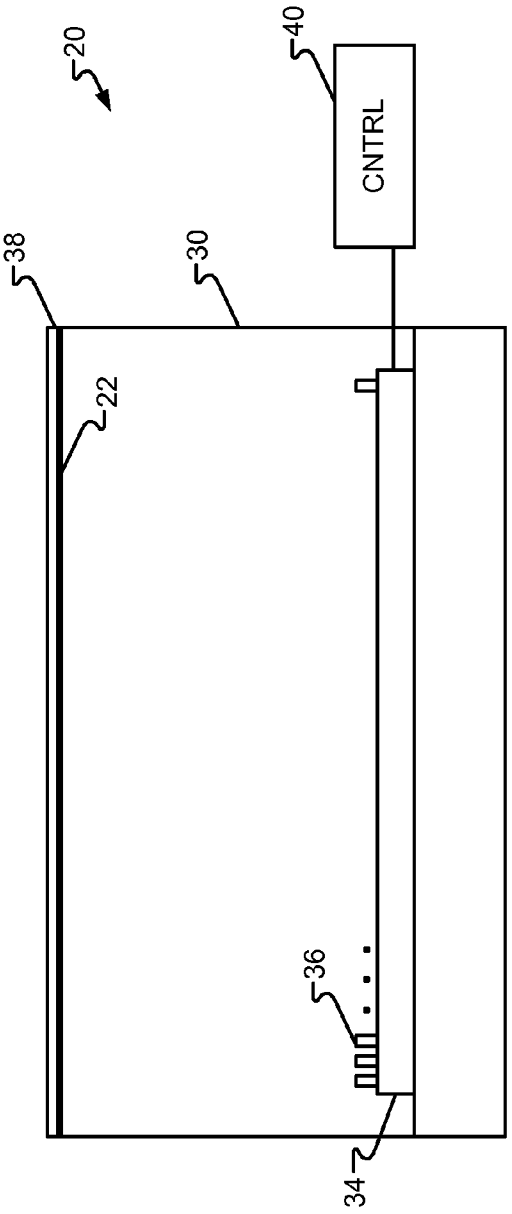
FIG. 2 shows an embodiment of a lighting module having a differential curing attachment.

The light module 20 emits ultraviolet light 24 that strikes the printed image and cures, or solidifies and fixes, the ink. The lighting module 20 may exist as part of the print head 18, or may reside separately. For ease of discussion, the lighting module resides separately from the print engine. In this embodiment, the lighting module includes an external optical element 22 upon which resides a pattern. The pattern selectively blocks and allows transmission of the light from the lighting module. By altering the amount of light striking the curable ink, the element 22 alters the time it takes for portions of the image to cure relative to other portions of the image. This affects the resulting gloss. Many users desire control of the gloss of an image The lighting module may include a bracket or support to hold the external element 24, or the print head may include such a support. This would allow the system user to change the external optical element to allow the use of different patterns. FIG. 2 shows a more detailed view of an embodiment of a lighting module.

In the embodiment of FIG. 2, the lighting module has a housing 30 in which resides a substrate 34. The substrate generally contains the traces and other necessary electronic components to allow an array of light emitters such as 36 to operate and produce light. The array of light emitters will typically consist of solid state light emitters, such as laser diodes or light-emitting diodes (LEDs). The array of light emitters will typically operate under control of a controller 40 such as a microprocessor, application specific integrated circuit (ASIC), microcontroller, etc., generally referred to here as a controller.

While solid state light emitters generally operate with less heat than other types of curing lighting assemblies such as arc lamps, they do generate heat. A heat sink, such as 32, may make contact with the housing 30 to remove heat from the lighting module or may be integrated with the housing 30. The heat sink may consist of an air cooled or liquid cooled heat sink and may employ any combination of fins, a fan, a refrigerated cooler, a heat pipe, a microchannel cooler, etc.

The array of light emitters may have one of many different configurations. They may reside in an x-y array, a line of single elements, consist of several substrates having either an x-y array, or a line arranged together, etc. Similarly, the lighting module may consist of several individual lighting modules mounted or other wise connected together into one lighting module.

In order to control gloss by employing differential curing, the lighting module will include an external optical element such as 24. As mentioned before the external optical element may mount to a bracket or other support separate from the window 38 of the lighting module 20. This merely provides one example of such an arrangement. The external optical element may also attach to the window of the lighting module, although this may make removal more difficult.

One could even print or otherwise form the pattern used to alter the gloss directly on the window of the light module. However, this may cause other issues with optical throughput, will make changing the pattern difficult and may prevent alteration of existing lighting modules. With an offset external optical element, where a gap exists between the element and the window, existing lighting modules could have the element installed adjacent them. Printing or otherwise forming the pattern on the glass may prevent previous lighting modules from having this capability.

In the embodiments where the pattern lies directly on the glass of the lighting module, the external optical element would consist of the pattern itself. One may also use a printed or otherwise patterned film on the window, as well, where the film would become the external optical element.

Generally, the pattern will vary in the cross-process direction. As shown in FIG. 1, the process direction defines the direction in which the print substrate travels. The cross-process direction lies perpendicular to that. Typically, the pattern cannot block all of the light for the entire process direction through which the substrate travels past the lighting module. Some of the light from the lighting module has to strike the ink to allow it to cure, even if more slowly or quickly than other portions of the ink in the image.

Figure 3:
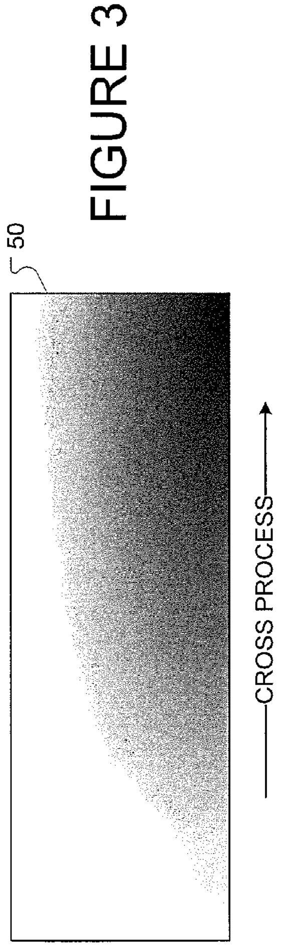
FIGS. 3-5 show examples of patterns usable for differential curing.
Figure 4:
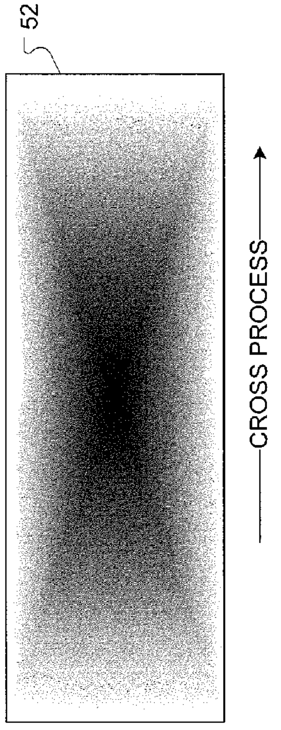
Figure 5:
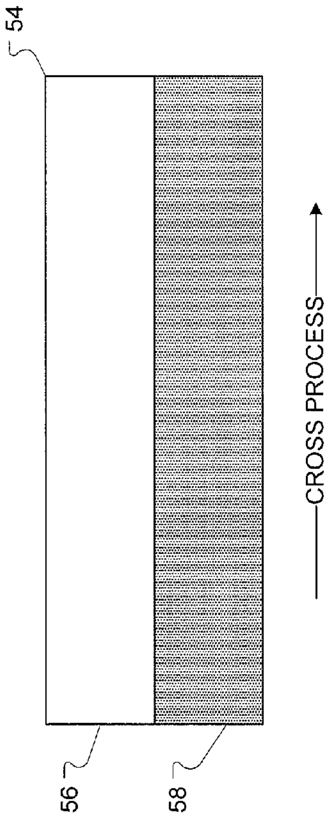

FIGS. 3-5 show examples of patterns. One should note that these are merely examples and are not intended to limit in any way other possible patterns or configurations. FIG. 3 shows the external optical element having a gradient pattern 50. As can be seen the pattern has a gradient in both the process and cross-process directions, with the cross-process direction shown by the CROSS PROCESS arrow and the process direction being perpendicular to that.

FIG. 4 shows an alternative pattern 52 to highlight that the pattern itself can take the form of any pattern, as long as it allows enough light in to cure the ink in all portions of the printed image, and allows for variability of the curing. The variability of curing alters the resulting gloss of the finished image.

FIG. 5 demonstrates an approach in which the ink first receives all of the illumination of the lighting module through the clear portion 56 of the pattern 54. The pattern then changes to a dither pattern at 58. The dither pattern may be randomly generated using a noise function, common in the use of dithering filters in displays. This pattern shows that the pattern may consist of blocks of varying patterns within the pattern itself. Other patterns may also occur, including tiger stripes or other animal-inspired patterns, block and checkerboard patterns, gradients, etc.

In this manner, a relatively simple component allows for alteration of the curing pattern in the ink of an image. Alteration of the curing pattern with regard to how long the ink takes to cure, as well as how much illumination the ink receives, alters the gloss across the image. This provides a simple, retrofittable way for printers to adjust and control the gloss of images.

Thus, although there has been described to this point a particular embodiment for a method and apparatus for an ink curing system using differential curing, it is not intended that such specific references be considered as limitations upon the scope of this invention except in-so-far as set forth in the following claims.

What is claimed is:

1. An ink curing system, comprising:

at least one array of solid state light emitters in a package having a window;

a patterned external optical element arranged adjacent to the window, the patterned external optical element forming an optical pattern on a print substrate when illuminated by light from the solid state light emitters;

said optical pattern comprising a first gradient in a process direction, wherein the process direction is parallel to a direction in which the print substrate moves relative to the at least one array of solid state light emitters, and a second gradient perpendicular to the process direction;

a printer arranged to deposit ink onto the print substrate, the ink being curable by optically patterned light, the array of solid state light emitters arranged adjacent to the print substrate such that the optically patterned light from the array contacts the ink, the patterned external optical element arranged between the at least one array of solid state light emitters and the print substrate to allow for variability of curing; and the patterned external optical element comprising a patterned external optical element directly adjacent to the window, said patterned external optical element comprising a patterned film on the window.

2. The ink curing system of claim 1, wherein the patterned external optical element comprises an offset patterned external optical element, wherein a gap exists between the offset patterned external optical element and the window.

3. The ink curing system of claim 1, wherein the patterned film comprises a dither pattern randomly generated using a noise function.

4. The ink curing system of claim 1, wherein the patterned film comprises a first patterned surface comprising a first pattern and a second patterned surface comprising a second pattern, wherein the first pattern is different from the second pattern.

5. The ink curing system of claim 1, wherein the patterned external optical element comprises a first portion with the patterned film and a second portion with a clear unpatterned surface.

6. An ink curing system, comprising:

at least one array of solid state light emitters in a package having a window;

a patterned external optical element arranged adjacent to the window, the patterned external optical element forming an optical pattern on a print substrate when illuminated by light from the solid state light emitters;

said optical pattern comprising a first gradient in a process direction, wherein the process direction is parallel to a direction in which the print substrate moves relative to the at least one array of solid state light emitters, and a second gradient perpendicular to the process direction;

a printer arranged to deposit ink onto the print substrate, the ink being curable by optically patterned light, the array of solid state light emitters arranged adjacent to the print substrate such that the optically patterned light from the array contacts the ink, the patterned external optical element arranged between the at least one array of solid state light emitters and the print substrate to allow for variability of curing; and the patterned external optical element comprising a patterned external optical element directly adjacent to the window, said patterned external optical element comprising a patterned coating on the window.

7. The ink curing system of claim 6, wherein the patterned external optical element comprises an offset patterned external optical element, wherein a gap exists between the offset patterned external optical element and the window.

8. The ink curing system of claim 6, wherein the patterned coating comprises a dither pattern randomly generated using a noise function.

9. The ink curing system of claim 6, wherein the patterned coating comprises a first patterned coating comprising a first pattern and a second patterned coating comprising a second pattern, wherein the first pattern is different from the second pattern.

10. The ink curing system of claim 6, wherein the patterned external optical element comprises a first portion with the patterned coating and a second portion with a clear unpatterned coating.

11. An ink curing system, comprising: at least one array of solid state light emitters in a package having a window; a patterned external optical element arranged adjacent to the window, the patterned external optical element forming an optical pattern on a print substrate when illuminated by light from the solid state light emitters; said optical pattern comprising a first gradient in a process direction, wherein the process direction is parallel to a direction in which the print substrate moves relative to the at least one array of solid state light emitters, and a second gradient perpendicular to the process direction; a printer arranged to deposit ink onto the print substrate, the ink being curable by optically patterned light, the array of solid state light emitters arranged adjacent to the print substrate such that the optically patterned light from the array contacts the ink, the patterned external optical element arranged between the at least one array of solid state light emitters and the print substrate to allow for variability of curing; and the patterned external optical element comprising of a patterned external optical element directly adjacent to the window, said patterned external optical element comprising a patterned surface on the window.

12. The ink curing system of claim 11, wherein the patterned external optical element comprises an offset patterned external optical element, wherein a gap exists between the offset patterned external optical element and the window.

13. The ink curing system of claim 11, wherein the patterned surface comprises a dither pattern randomly generated using a noise function.

14. The ink curing system of claim 11, wherein the patterned surface comprises a first patterned surface comprising a first pattern and a second patterned surface comprising a second pattern, wherein the first pattern is different from the second pattern.

15. The ink curing system of claim 11, wherein the patterned external optical element comprises a first portion with the patterned surface and a second portion with a clear unpatterned surface.

* * * * *